United States Patent [19]

Harris, Jr. et al.

[11] 4,074,128
[45] Feb. 14, 1978

[54] PHOTOELECTRIC SIGNAL GENERATING CIRCUITS

[75] Inventors: Samuel C. Harris, Jr., Waynesboro; William A. Hanger, Churchville, both of Va.

[73] Assignee: General Electric Company, Waynesboro, Va.

[21] Appl. No.: 789,854

[22] Filed: Apr. 22, 1977

Related U.S. Application Data

[63] Continuation of Ser. No. 683,418, May 5, 1976, abandoned.

[51] Int. Cl.² .................................................. G01J 1/32
[52] U.S. Cl. .............................. 250/205; 250/231 SE; 324/175
[58] Field of Search ........ 250/231 R, 231 SE, 237 G, 250/237 R, 205, 209, 199, 214 C; 356/169, 170; 324/175

[56] References Cited

U.S. PATENT DOCUMENTS

| | | | |
|---|---|---|---|
| 3,721,123 | 3/1973 | Heim | 250/231 SE |
| 3,755,687 | 8/1973 | Garnett | 250/205 |
| 3,806,254 | 4/1974 | Ha et al. | 250/237 G |

Primary Examiner—David C. Nelms
Attorney, Agent, or Firm—Michael Masnik

[57] ABSTRACT

A regulator for a two phase shaft encoder used in sensing irregular body movements which determines when the light transmission of a photocoupler is maximum and corrects the photocoupler output to agree with a reference value.

10 Claims, 3 Drawing Figures

TWO PHASE PHOTO ELECTRIC REGULATOR

PHOTO ELECTRIC SHAFT ENCODER

TRANSMITTED LIGHT VERSUS DISPLACEMENT

TWO PHASE PHOTO ELECTRIC REGULATOR

PHOTOELECTRIC SIGNAL GENERATING CIRCUITS

This is a continuation of application Ser. No. 683,418, filed May 5, 1976 now abandoned.

FIELD OF THE INVENTION

The present invention relates to photoelectric signal generating circuits and more particularly to the use of photoelectric apparatus for sensing recorded information expressed in the form of the presence or absence of indicia born on a carrier moving relative to such photoelectric apparatus.

BACKGROUND OF THE INVENTION

A common means of sensing movement is by interruption of a light beam with an opaque body so as to effect an electrical response in a photosensitive element. The compact and convenient device for this purpose is a photocoupler which may comprise a light emitting diode, LED, for the light source and a phototransistor for the light sensitive element. These components when placed in close proximity with the carrier bearing spaced indicia as for example by slotting or perforating the carrier body, being installed between them can provide an electrical indication of motion. As the carrier which may be moved, the resulting series of light interruptions provide a series of electrical impulses from the phototransistor. In such an application it is important that the photocoupler output is maintained constant for controlling purposes. Unfortunately, however, the electrical stability of both the light emitting diode and the phototransistor is less than that required for many applications. For example, it is not uncommon for the quantum efficiency of LED's to vary with temperature changes, current changes and to vary from one device to another. The light sensitivity of phototransistors varies also with operating conditions and from device to device. An overall gain, herein defined as the product of the ratio of light intensity to LED current and the ratio of incident light to phototransistor output current, may vary as much as 100 to 1. This makes it difficult to establish a threshold for the phototransistor current which separates the light condition from the dark condition. A manual adjustment such as by a potentiometer adjustment, provides inadequate protection against short term drift such as one might expect from either temperature change or variation in ambient lighting. Where the relative motion of the indicia carrying carrier and the photocouplers is constant, it may be possible to compare the amplitude of the resulting periodic wave form from the photocoupler with a reference and use the result to automatically adjust the drive current in the light source. However, where the motion is not constant as in the movement of for example a print head carriage, no such simple comparison is suitable. The problem is made even more acute when the relative motion of the photocoupler and the indicia carrying carrier includes starting and stopping.

It is an object of the present invention to provide an improved photocoupler arrangement for sensing modulation of a light beam with a body so as to effect an electrical response in a photosensitive element.

Another object of this invention is to provide improved circuitry for automatically adjusting photocoupler operation used with a moving indicia carrier.

Another object of the invention is to provide an improved photocoupler circuit operative to accurately establish the position of indicia carried on a carrier.

In accordance with one embodiment of the present invention, means are provided for determining when the light transmission in a photocoupler is maximum. When light transmission is at maximum, the current in the LED is corrected to cause the photocell output current to match a reference value. The value of LED current is stored digitally in a register and maintained until the condition for maximum light transfer occurs. At this point comparisons of the LED current value and a reference value take place and the stored value of the LED current modified in order to maintain a constant photocoupler output for varying operating conditions.

A complete understanding of the invention and a fuller appreciation of its objects and features will be available from the following detailed description which is made in conjunction with the drawing of a particular illustrative embodiment.

DESCRIPTION OF THE PREFERRED EMBODIMENT

Figure 1:
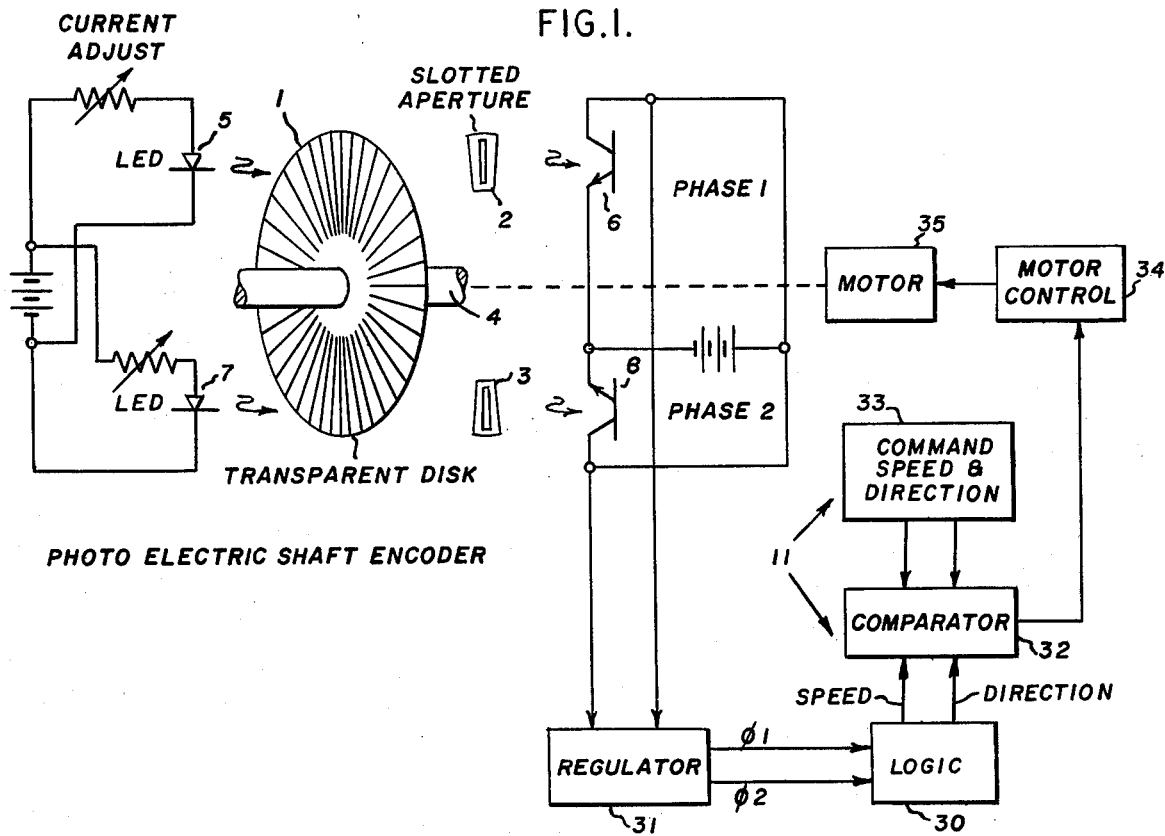
FIG. 1 illustrates in part block diagram, part schematic form a two phase shaft encoder common in the prior art.

FIG. 1 illustrates a two phase shaft encoder of the prior art that may be used, for example, in the carriage position servo of a matrix printer. This device comprises a transparent disc or carrier 1 which has opaque indicia or radial lines which move with relation to radially slotted apertures 2 and 3 which have the same slot pitch as that of the radial lines on the disc and also are orthogonal to the axis 4 of rotation of the disc. With a light source, the LED 5 placed on one side of the disc aperture arrangement and a light sensor, the phototransistor 6 placed on the other side, there exists angular positions for both maximum and minimum light transmission between source and said sensor. To provide direction sensing the two apertures are positioned to provide a quadrature phase relation between the phototransistor outputs. Aperture 3 is provided with its own LED 7 cooperating with an associated phototransistor 8 located on the opposite side of the aperture 3. Similarly aperture 2 has associated with it an LED 5 and a phototransistor 6. With this arrangement, when light transmission through one aperture reaches maximum, it is at half amplitude through the other aperture. When light transmission is at half amplitude through the first aperture, it is a minimum value through the other.

Figure 2:
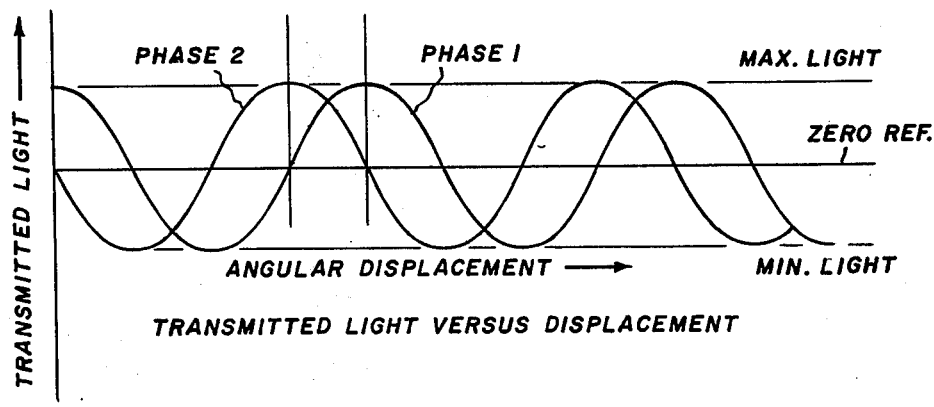
FIG. 2 illustrates graphically the phase relationships obtained from the two photocouplers employed in the arrangement of FIG. 1.

FIG. 2 illustrates in graphical form the relationship of light transmission to angular displacement for this shaft encoder wherein angular displacement of the transparent disc 1 is plotted as an ordinate and the light transmitted through the disc and received by the associated phototransistor is plotted as the abscissa. Thus the wave form identified as phase 1 would illustrate the variation in amplitude of light intensity produced at the output of the phototransistor 6, for example, and the output of the phototransistor 8 would be indicated as the phase 2 wave form. For purposes of discussion the maximum light intensity from either phototransistor is identified by the horizontal line marked maximum light. The half amplitude level of the phase 1 or phase 2 wave forms corresponds to the zero crossing point of the wave forms. That is, the point about which the sinusoidal wave forms undergo excursions from minimum light displacement to maximum light displacement. If we consider the half amplitude point to be zero reference we see that the extremes in amplitude in one phase are reached at zero crossing points of the other phase. By sensing the zero crossing of the positive transition for phase 1, we establish the point of maximum amplitude for phase 2, and by sensing the zero crossing of the negative transition of phase 2, we know the point of maximum amplitude for phase 1. This feature is employed in the present invention as will now be described.

Figure 3:
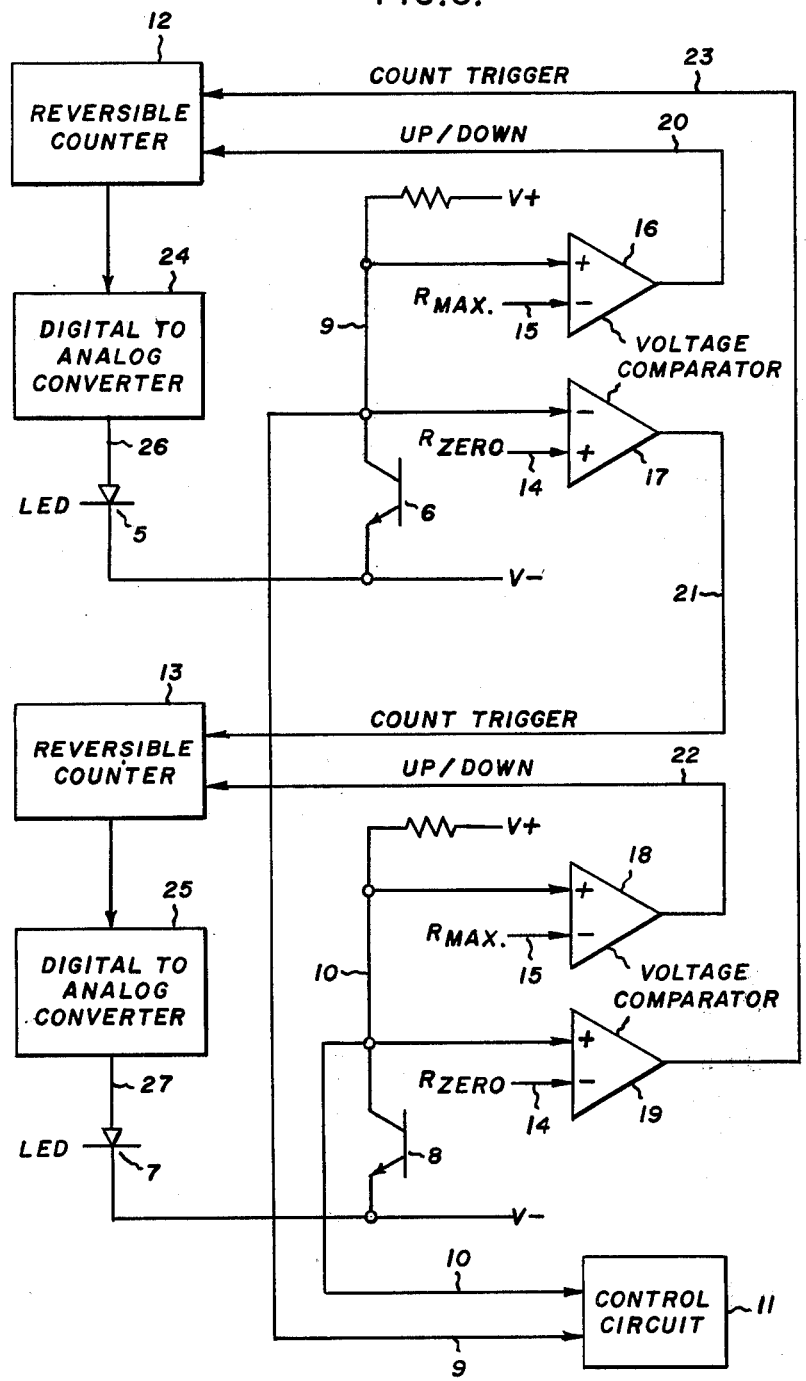
FIG. 3 illustrates in part block diagram, part schematic form a regulating system in accordance with the present invention for automatically adjusting the photocoupler arrangement to provide an output signal which is constant for varying operating conditions.

FIG. 3 illustrates the circuit for regulating the LED currents of both phases to keep the associated phototransistor maximum light currents matched to a reference level. As previously mentioned, it is important in the application of photocouplers described herein to produce a constant output despite variations in temperature current or variations in the LED and phototransistor devices. Briefly speaking, a complex control loop for both phases contains voltage comparator amplifiers 16, 17, 18 and 19 which in a particular embodiment may be contained in a common integrated circuit package. Two voltage comparator amplifiers are utilized to compare a respective transistor collector voltage with a zero crossing reference voltage, $R_{zero}$. Another pair of voltage comparators are utilized to compare a respective collector voltage with a maximum reference voltage, $R_{max}$. The output of these voltage comparators are logic levels which may be used to operate a reversible binary counter. When a collector voltage of one phase crosses the zero reference value, the amplifier switches its polarity to provide a count pulse to the counter of the other phase. The maximum amplitude comparator of that phase determines the direction of counting. The circuits are arranged for increasing the count if the transistor current is too low and decreasing the count if it is too high. A digital to analog converter controlled by the binary counter supplies the level of current to the LED in accordance with binary value in the counter. Initially, the value of both counters is set at full count to insure operation, but after a few increments of the shaft the regulators are settled with proper values on the counters. In this scheme, regulation is expected to be convergent over the full range of conditions encountered. The result is that the photocoupler arrangement provides a consistent pair of output signals on leads 9 and 10 for application to a control circuit 11. Either one of these signals alone provides an indication of speed as measured by the shaft encoder while the pair of signals in combination provides an indication of direction. The circuit 11 may be the control circuit for a servo motor control which drives an output shaft which in turn is coupled to the encoder shaft 4 for providing a position or speed control. Briefly the control circuit 11 may comprise a logic circuit 30 having the phase one and phase two pulse rates available from regulator 31 applied thereto as inputs. Circuit 30 responds to the order of light transitions identified by the input signals to indicate shaft direction and to the rate of transitions to indicate shaft speed. Circuit 30 applies a speed signal in the form of a logic pulse rate to comparator 32 and a direction signal in the form of a logic level. Comparator 30 compares the command velocity pulse rate signal and a direction command logic level signal available from a source 33 and the corresponding signals available from source 30 to provide a control signal to motor control 34. Motor control 34 responds to the positive going, negative going or no signal available from 32 to drive the motor 35 in the direction to agree with the commanded velocity and direction. The control circuit 11 as described is well known and is described herein for background information purposes.

As previously mentioned, the present invention is directed to a photoelectric apparatus for sensing recorded information expressed in the form of the presence or absence of indicia born on a moving carrier such as the disc 1 and for expressing such information as sensed in the form of electrical signals available on leads 9 and 10. The apparatus comprises a first and second light emitting diode 5 and 7 positioned adjacent the carrier shown in FIG. 1 for illuminating said carrier such that the illumination is propagated by the carrier according to the presence and absence of indicia contained thereon. Respective phototransistors 6 and 8 are positioned adjacent their associated apertures for example apertures 2 and 3 shown in FIG. 1. As previously mentioned, the aperture arrangements are such that when light illumination propagated by the carrier and the first aperture arrangement reaches a maximum amplitude illumination passed by the carrier, the second aperture arrangement is at half the maximum amplitude. A first reversible counter 12 is associated with the first photocoupler comprising the light emitting diode 5 and the phototransistor 6. A second reversible counter 13 is associated with the second photocoupler comprising a light emitting diode 7 and its associated phototransistor 8. A zero or half amplitude reference signal source 14 and a maximum amplitude reference signal source 15 are applied to four voltage comparators. Voltage comparator 16 has applied to its input the output of the phototransistor 6 and the maximum reference signal from source 15. The ouput of this voltage comparator is coupled to the reversible counter 12 for controlling direction of counting by counter 12. Voltage comparator 19 has coupled to its input the output of phototransistor 8 and the zero reference crossing signal available from source 14. The output of the voltage comparator 19 is applied to the reversible counter 12 to change the count of this reversible counter in the direction established by the direction signal developed on lead 20. In a similar manner the voltage comparator 17 responds to the output of phototransistor and the zero reference signal available from 14 applied to its input to produce voltage transition pulses on lead 21 to change the count of the reversible counter 13. The voltage comparator 18 responds to the output of phototransistor 8 and the maximum amplitude reference signal available from source 15 applied to its input to produce a signal on lead 22 for controlling the direction in which the reversible counter 13 is counted in accordance with the signals available on lead 21. The output of reversible counter 12 in the form of digital signals is applied to an associated digital to analog converter 13 to provide a current on the input lead 26 to LED 5 for adjusting its light intensity. In a similar manner reversible counter 13 produces a digital signal and applies it to the digital to analog converter 25 to control the current applied to LED 7 over input lead 27. Thus, the respective comparators compare the photodetector outputs with respective half amplitude or zero crossing reference signals and respective maximum amplitude reference signals to provide respective logic level signals. Means are provided to sense when a photodetector output of one phase crosses a half amplitude or zero reference value to provide a predetermined count pulse to the counter of the other phase. When the photodetector output of one phase reaches the maximum reference value means are provided to determine the direction of counting of a counter associated with the other phase. A digital to analog converter coupled between each of the counters and associated photoconductors modifies the illumination provided by the associated photodetectors in accordance with the count stored in the counter associated with such detectors. In this manner despite major changes in the photoelectric components associated with the photocouplers the shaft encoder arrangement shown produces at the output leads 9 and 10 a consistent signal in both phase and amplitude for system control. Where, for example, the system involves a servo motor drive the arrangement shown results in more dependable performance in both reliability and accuracy.

While the invention has been shown in terms of controlling the current being applied to the LED's and hence the illumination provided by these devices, it is obvious that the present invention can be extended to utilizing the output of the reversible counters 12 and 13 to control the photosensitivity of the photocoupler arrangement comprising the LED and the phototransistor as for example by controlling either the current through the LED or the sensitivity or gain of the phototransistor or controlling the transmittance of the light path between the light emitting diode and the phototransistor.

A detailed preferred embodiment of the invention has been shown and described. Specific circuit parameters have been provided as an aid in understanding and practicing the invention; however the presentation of these parameters should not be considered to be limiting. Modifications will immediately be apparent to those skilled in the art and all such modifications coming within the spirit and scope of this disclosure are intended to be covered by the appended claims.

What I claim as new and desire to secure by Letters Patent of the United States is:

1. An arrangement wherein a shaft encoder comprises a first and second source of light, and means are provided for pulsing said sources of light with light opaque and light transparent segments provided on a rotating disc and representative of the angular position of the shaft, means for regulating the light intensity of said sources comprising a first and second sensor for sensing the light interrupted by said disc at separate predetermined points to provide a respective one of a pair of signals, wherein the amplitudes of said pair of signals are phase displaced by 90° as light passed by the disc changes recurrently through a cycle of maximum to minimum to maximum intensity as the shaft and disc rotate, a respective reversible counter and a respective digital to analog converter associated with each of said first and second light sources, a source of a first and second reference signal for each sensor, means for comparing the voltage developed by each sensor with one of said first and one of said second reference signals to provide first and second control signals respectively, means responsive to the first control signal associated with one sensor to change the count of the reversible counter associated with the second sensor by a predetermined count, means responsive to the second control signal associated with said second sensor to control the direction of said predetermined count, each of said digital to analog converters responsive to the count of the reversible couner associated therewith to provide an analog signal, each source of light responsive to its associated analog signal to vary its light intensity to regulate the amplitude of the light pulses with respect to said given reference levels.

2. A photoelectric apparatus for sensing recorded information expressed in the form of the presence or absence of indicia born on a moving carrier and for expressing such information as sensed in the form of electrical signals comprising a first and second photocoupler, said couplers comprising a light source positioned adjacent said carrier for illuminating said carrier such that the illumination is propagated by said carrier according to the presence and absence of said indicia, said couplers further comprising a respective detection means positioned adjacent said carrier for detecting said illumination from said source as propagated by said carrier to provide a respective output signal, a source of a first reference signal, means coupled to one said detection means for determining when the illumination propagated by said carrier to the other of said detection means is a maximum, and for detecting the value of said maximum illumination to provide a first signal, means for comparing said first signal with said reference signal to produce an error signal and means for modifying the amplitude of illumination of said other detection means by said source in accordance with said error signal.

3. A photoelectric apparatus for sensing recorded information expressed in the form of the presence or absence of indicia born on a moving carrier and for expressing such information as sensed in the form of electrical signals comprising a first and a second light emitting diode positioned adjacent said carrier for illuminating said carrier such that the illumination is propagated by said carrier according to the presence and absence of said indicia, means positioned adjacent said carrier for detecting said illumination from said source as propagated by said carrier, said means comprising first and second detectors, a first aperture arrangement positioned between said carrier and said first detector, a second aperture arrangement positioned between said second detector and said carrier, means for positioning said aperture arrangements such that when light illumination propagated by said carrier and said first aperture arrangement reaches a maximum amplitude illumination passed by said carrier, said second aperture arrangement is at half the maximum amplitude, a first reversible counter associated with said first light emitting diode and a second reversible counter associated with said second light emitting diode, a half amplitude reference signal source and a maximum amplitude reference signal source associated with each of said first and second detectors, respective comparators for comparing the photodetector outputs with a respective half amplitude reference signal and respective maximum amplitude reference signal to provide respective logic level signals, means responsive when a photodetector output of one phase crosses the half amplitude reference value to provide a predetermined count pulse to the counter of the other phase, means responsive when the photodetector output of one phase reaches the maximum reference value to determine the direction of counting of the counter associated with the other phase, a digital to analog converter coupled between each of said counters and its associated photodetector for modifying the illumination provided by said associated photodetector in accordance with the count stored in the counter associated with such detector.

4. Apparatus for regulating output signals from a photosensor coupled with a light source by way of a first transmission path traversing a region recurrently varying the attenuation of energy propagated along said path comprising power control means coupled to said light source, means for developing a first signal wave from the output of said photosensor, means for developing a second signal wave having the same periodicity as said first signal wave and shifted in time with respect thereto, and means for acting on said power control means in accordance with the timing action of said second signal wave and controlled as to sense by said first signal wave.

5. Apparatus according to claim 4 wherein said time shift is of a magnitude placing said second signal wave substantially in quadrature with said first signal wave.

6. Apparatus according to claim 5 wherein said means for developing said second signal wave includes a second light source and photosensor coupled over a second transmission path of variable attenuation.

7. Apparatus according to claim 4 further comprising a counter, means for controlling the operation of said counter by said second signal wave and means for modifying the count content of said counter by said first signal wave.

8. Apparatus according to claim 7 further comprising a digital to analog converter coupled to an output of said counter for acting on the function of said power control means.

9. In combination, a first and second radiant energy sensor coupled with a respective first and second radiant energy source by way of a first and second transmission path traversing a region which recurrently varies the attenuation of energy propagated along said paths, first and second control means coupled to said first and second sources respectively, first means coupled to said first sensor for developing a first signal wave representative of the propagation of energy from said first source to said first sensor by way of said first transmission path, second means coupled to said second sensor for developing a second signal wave representative of the propagation of energy from said second source to said second sensor by way of said second transmission path, a first counter associated with said first source, a second counter associated with second source, the passage of said first wave through a reference level enabling said second counter, the passage of said second wave through a reference level enabling said first counter, the level of said first wave during first counter enablement operating said first counter, the level of said second wave during second counter enablement operating said second counter.

10. An arrangement according to claim 9 further comprising means for controlling the sense of each counter's operation in response to the sense of the difference between the signal wave actuating the respective counters and a reference level for such last named signal wave.

* * * * *